(12) United States Patent
Mayfield et al.

(10) Patent No.: US 12,507,345 B2
(45) Date of Patent: Dec. 23, 2025

(54) RE-WORKABLE SOCKETED SPACE SAVING MAGNETICS

(71) Applicant: Rockwell Collins, Inc., Cedar Rapids, IA (US)

(72) Inventors: James B. Mayfield, Cedar Rapids, IA (US); Andre G. Moorman, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 182 days.

(21) Appl. No.: 18/442,610

(22) Filed: Feb. 15, 2024

(65) Prior Publication Data

US 2025/0267794 A1    Aug. 21, 2025

(51) Int. Cl.
*H05K 1/18* (2006.01)

(52) U.S. Cl.
CPC ..... *H05K 1/181* (2013.01); *H05K 2201/10325* (2013.01); *H05K 2201/10977* (2013.01)

(58) Field of Classification Search
CPC ..................................................... H05K 1/181
USPC ............................................................ 361/760
See application file for complete search history.

(56) References Cited

U.S. PATENT DOCUMENTS

| | | | |
|---|---|---|---|
| 7,524,206 B2 | 4/2009 | Gutierrez et al. | |
| 7,773,390 B2 * | 8/2010 | Weir | H05K 1/116 361/794 |
| 7,821,790 B2 | 10/2010 | Sharma et al. | |
| 7,835,157 B2 * | 11/2010 | Tilmans | B81B 7/0006 361/765 |
| 8,576,570 B2 | 11/2013 | Nguyen et al. | |
| 10,367,415 B1 | 7/2019 | Sturcken et al. | |
| 2008/0239683 A1 * | 10/2008 | Brodsky | H01R 12/52 29/854 |
| 2022/0005788 A1 * | 1/2022 | Fricker | H01L 23/32 |

* cited by examiner

*Primary Examiner* — Stanley Tso
(74) *Attorney, Agent, or Firm* — Suiter Swantz IP

(57) ABSTRACT

A system including a power component that is configured to be removably couplable to a printed circuit board (PCB) assembly is disclosed. The power component may include a power sub-component coupled to a plurality of wire leads and a carrier. The carrier may include a body defining a recess configured to receive the power sub-component and support legs extending from the body. The power component may be elevated above PCB components by virtue of the support legs. The system may also include pins configured to be coupled to the plurality of wire leads and inserted through the attachment features and into receiving features (e.g., sockets) of the printed circuit board assembly to electrically couple the plurality of wire leads to the receiving features of the printed circuit board assembly.

20 Claims, 3 Drawing Sheets

RE-WORKABLE SOCKETED SPACE SAVING MAGNETICS

TECHNICAL FIELD

The present disclosure relates generally to electronics, and more particularly, to a power component configured to be coupled to a printed circuit board assembly.

BACKGROUND

One solution to provide power is to solder a power supply component (e.g., power supply) directly to a circuit board.

However, this solution may include a number of drawbacks. For instance, the soldering or de-soldering of a power component with a large thermal mass may use large amounts of heat to fuse or un-fuse the solder. The heat generated can damage the circuit board or other components. If the power component fails in the future, it can be difficult to replace without damaging the circuit board. Furthermore, direct soldering of the power component to the circuit board can limit the space available for electronics, and the flexibility in the design and layout of the circuit board.

Therefore, there is a need for an improved system.

SUMMARY

A system is disclosed in accordance with one or more illustrative embodiments of the present disclosure. In one illustrative embodiment, the system may include a power component that is configured to be removably couplable to a printed circuit board assembly. In another illustrative embodiment, the power component may include a power sub-component coupled to a plurality of wire leads and a carrier. In another illustrative embodiment, the carrier may include a body defining a recess configured to receive the power sub-component and a plurality of support legs extending from the body. In another illustrative embodiment, the power component may be elevated above PCB components extending from the top surface of the printed circuit board assembly by virtue of the plurality of support legs. In another illustrative embodiment, the system may include pins configured to be coupled to the plurality of wire leads and inserted through the attachment features and into receiving features of the printed circuit board assembly to electrically couple the plurality of wire leads to the receiving features of the printed circuit board assembly.

In a further aspect, the pins may be structurally rigid. In another aspect, the power sub-component may be coupled to the carrier via an adhesive between the power sub-component and the carrier. In another aspect, the pins may be coupled to the plurality of wire leads via a bonding material. In another aspect, the power component may further include a potting agent material configured to encapsulate at least a portion of the power component. In another aspect, the system may further include the printed circuit board assembly. In another aspect, the receiving features of the printed circuit board assembly may include a plurality of sockets configured to receive the pins of the power component. In another aspect, the printed circuit board assembly may include voids for receiving the receiving features. In another aspect, the receiving features may be disposed proximate to an outer footprint perimeter of the power component when the power component is coupled to the printed circuit board assembly. In another aspect, the printed circuit board assembly may include the PCB components inside the outer footprint perimeter.

A system is disclosed in accordance with one or more illustrative embodiments of the present disclosure. In one illustrative embodiment, the system may include a printed circuit board assembly and a power component. In another illustrative embodiment, the power component may be configured to be removably couplable to the printed circuit board assembly. In another illustrative embodiment, the power component may include a power sub-component coupled to a plurality of wire leads, a carrier, and pins. In another illustrative embodiment, the carrier may include a body defining a recess configured to receive the power sub-component and a plurality of support legs extending from the body. In another illustrative embodiment, the pins may be configured to be coupled to the plurality of wire leads and inserted through the attachment features and into receiving features of the printed circuit board assembly.

In a further aspect, the pins may be structurally rigid. In another aspect, the power sub-component may be coupled to the carrier via an adhesive. In another aspect, the pins may be coupled to the plurality of wire leads via a bonding material. In another aspect, the power component may further include a potting agent material configured to encapsulate at least a portion of the power component. In another aspect, the receiving features of the printed circuit board assembly may include a plurality of sockets configured to receive the pins of the power component. In another aspect, the plurality of sockets may be soldered to the printed circuit board assembly. In another aspect, the printed circuit board assembly may include voids for receiving the receiving features. In another aspect, the receiving features may be disposed proximate to an outer footprint perimeter of the power component when the power component is coupled to the printed circuit board assembly. In another aspect, the printed circuit board assembly may include the PCB components inside the outer footprint perimeter.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Figure 1:
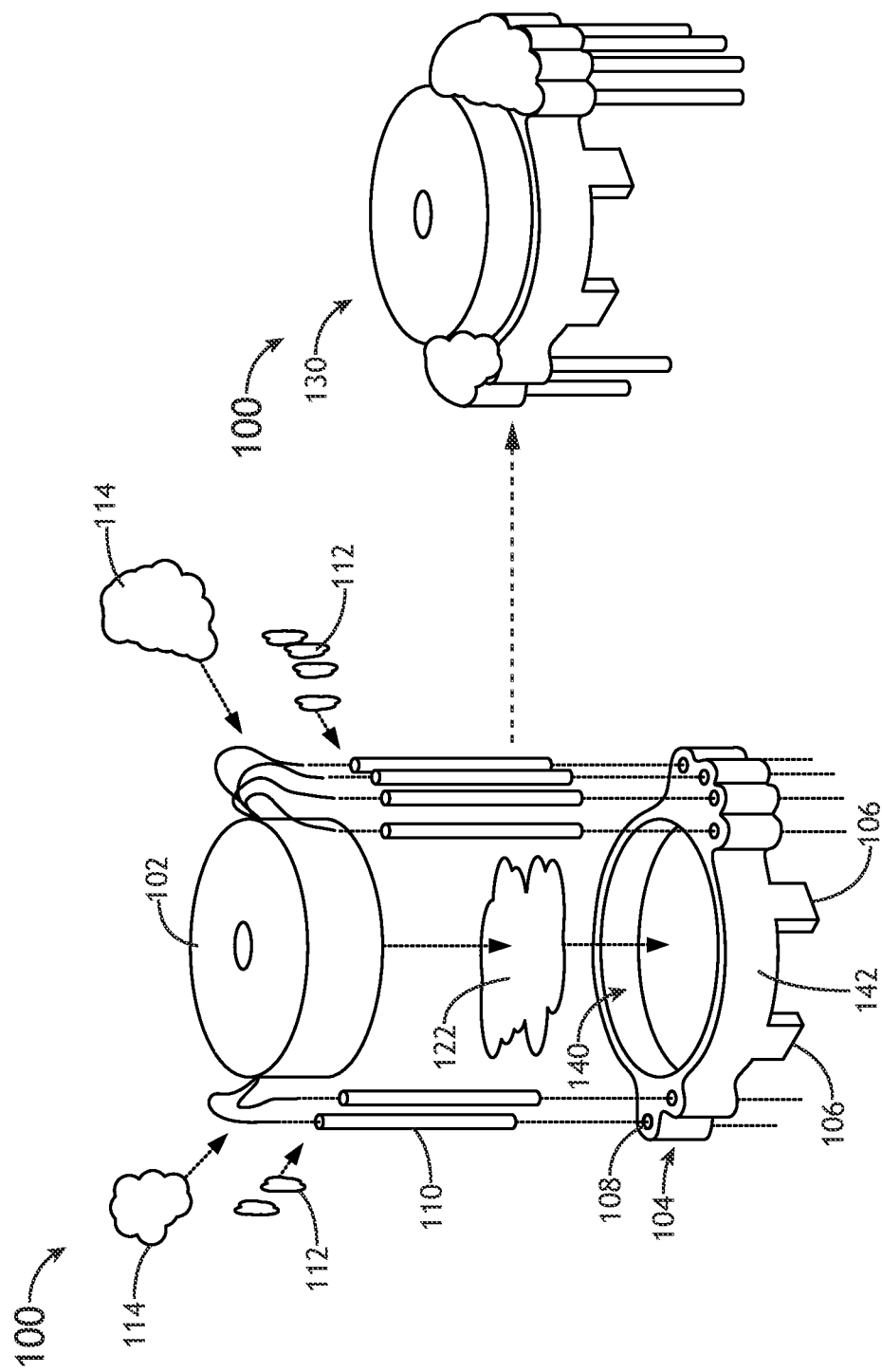
FIG. 1 is an exploded assembly view of a power component next to an assembled power component, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

Broadly speaking, embodiments of the concepts disclosed herein are directed to a system configured for coupling a power component to a printed circuit board assembly (i.e., PCB assembly), such as by using sockets and pins to allow for quick assembly and disassembly.

Rather than direct soldering the power component to the printed circuit board, a custom carrier body may be used to elevate the power component above the PCB. Benefits may include saving space and weight by not requiring non-electrically functional PCB footprint to be reserved for only the power component. The z-direction (i.e., vertical direction for purposes of this disclosure) above and normal to a top surface of the PCB board may be used more efficiently. Tabs/legs of the custom carrier may be used to space the power component away from the PCB, while letting PCB components (e.g., transistors, capacitors, etc.) to still occupy the footprint below the power component. It is contemplated that positioning the power component above, but still relatively close, to the PCB and supporting components (e.g., transistors, capacitors, and the like) may provide relatively improved electrical performance (e.g., less parasitic capacitance/inductance when closer to the supporting components) than other methods (e.g., placing the power component further away from the PCB). The power component including the power sub-component (e.g., magnetics) and carrier may be removably coupled (e.g., swappable) using sockets and pins or other fasteners, which may allow for replacing a damaged power component, as well as to access the PCB components below the power component.

In this regard, embodiments herein may perform better than other methodologies such as direct soldering to the PCB.

Embodiments may allow for easy removal and replacement of the power component without damaging the printed circuit board assembly, and provides flexibility in the design and layout of the circuit board.

FIG. 1 illustrates an exploded assembly view of a power component 130 (e.g., assembly of a power sub-component 102 configured to provide power and a carrier 104) next to a view of an assembled power component 130, in accordance with one or more embodiments of the present disclosure.

The system 100 may include the power component 130.

In some embodiments, the system 100 may include the printed circuit board assembly 200.

The power component 130 may be configured to be removably couplable to the printed circuit board assembly 200. For example, the power component 130 may be swappable and non-permanently coupled. For instance, the power component 130 may be fastened temporarily using any method. For example, the pins 110 may be temporarily coupled to sockets 204. Alternatively, and/or in addition, the power component 130 may be removably coupled via machine screws with nuts (e.g., screws that go through and nuts on the bottom of the printed circuit board assembly 200); clip-in mechanical fasteners; compression from neighboring mechanical assemblies; and/or the like.

The power component 130 may include a power sub-component 102. The power sub-component 102 may be or include any component configured to provide power to and/or from the PCB assembly 200. For example, the power sub-component 102 may include a magnetic component. For instance, the magnetic component may include a transformer or inductor. For instance, the transformer or inductor may be a majority of the power sub-component 102. The power component 130 may be configured as a power supply. The power sub-component 102 may be more than one component on the carrier 104. For example, the power sub-component 102 may include power supply component modules and/or other devices that are not just magnetics. The power sub-component 102 may be coupled to a plurality of wire leads 124.

The power sub-component 102 may be round as shown, such as a cylinder having an outer diameter that is larger than a height.

The power component 130 may also include a carrier 104. The carrier 104 may include a body 142 that defines a recess 140. The recess 140 may be configured to receive the power sub-component 102. For example, the body 142 may be cylindrical in shape. The body 142 may be configured to receive the power sub-component 102 into the recess 140 from above (e.g., z-direction, vertically, normal to the printed circuit board assembly 200) by virtue of the recess facing upwards.

The body 142 may further define attachment features 108 for coupling the carrier 104 to the printed circuit board assembly 200. For example, the attachment features 108 may be voids (e.g., holes as shown), slots, mechanical clamps, and/or the like. For instance, the body 142 may define (and/or include) the attachment features 108 around an outer perimeter when viewed from above. For example, the body 142 may define six or more attachment features 108 as shown. For instance, two on a first side opposite four on an opposing side of the body 142.

The carrier 104 may also include a plurality of support legs 106 extending from the body 142. The support legs 106 may be configured to space the body 142 an elevated distance 302 above the printed circuit board assembly 200 (e.g., see FIG. 2) when the support legs 106 are in contact with a top surface 202 of the printed circuit board assembly 200. By virtue of the plurality of support legs 106, the power component 130 may be configured to be elevated above PCB components 210 extending from the top surface 202 of the printed circuit board assembly 200. In this way, an empty space may allow for PCB components 210 below the body 142 of the power component 130, more efficiently utilizing the full top surface 202. The PCB components 210 may include electrical components extending upwards, such as a capacitor 210a, a transistor 210b, and/or the like.

The support legs 106 may be of various designs and configurations, providing structural integrity as well as precise spacing between the power component 130 and the printed circuit board assembly 200. For example, the support legs 106 may be integrally formed with the carrier 104 or may be separate components that are attachable to the carrier 104. The material of the support legs 106 may be chosen based on thermal, electrical, and mechanical properties that suit the particular application. For instance, the support legs 106 may be made of a polymer that provides electrical insulation while also having sufficient strength to support the weight of the power component 130. Additionally, the support legs 106 may include features to enhance mechanical stability, such as flanges or interlocking mechanisms, which may interact with corresponding structures on the printed circuit board assembly 200. These features may ensure that the power component 130 remains securely in place during operation and can withstand vibrations or shocks that may occur in the operating environment. The elevated distance 302 (see FIG. 3 for example elevated distance 302) provided by the support legs 106 may be determined based on factors such as airflow requirements for cooling, a height of the PCB components 210, and a need for electrical isolation. By optimizing the height of the support legs 106, the system 100 may achieve a balance between space utilization and performance characteristics such as cooling efficiency and reduced electromagnetic interference. For example, the elevated distance 302 may be less than 1 centimeter from the tallest PCB component 210. For example, the elevated distance 302 may be less than 0.1 centimeter from the tallest PCB component 210. For example, the elevated distance 302 may be less than 2 centimeters from the carrier 104 (e.g., a flat body of the carrier) to the top surface 202 of the PCB assembly 200.

The printed circuit board assembly 200 may be configured to accommodate the support legs 106, and/or vice versa, such as each support leg 106 aligned with a flat area of the top surface 202 absent of PCB components 210.

Referring back to FIG. 1, the power component 130 may include pins 110. The pins 110 may be configured to be coupled to the plurality of wire leads 124. For example, the pins 110 may be coupled to the plurality of wire leads 124 via a bonding material 112 (e.g., solder material such as lead or the like), such as soldering the wire leads 124 to the top of each pin 110.

The pins 110 may be configured to be inserted through the attachment features 108 and into receiving features 204 of the printed circuit board assembly 200 to electrically couple the wire leads 124 to the receiving features 204 (e.g., sockets) of the printed circuit board assembly 200. For example, the pins 110 may be inserted into and slide into sockets 204 placed in holes 206 of the printed circuit board assembly 200 as shown. The pins 110 may be structurally rigid, which may allow the pins 110 to more easily align with and be inserted into the receiving features 204. The pins 110 may comprise electrically conductive material along their length to conduct electricity, such as being made of a metal. This may allow power to be distributed to and/or from the printed circuit board assembly 200. The pins 110, when assembled to the carrier 104, may extend below and through the body 142 of the carrier 104. The pins 110, when assembled to the PCB assembly 200, may extend below and through the entire PCB assembly 200.

Figure 2:
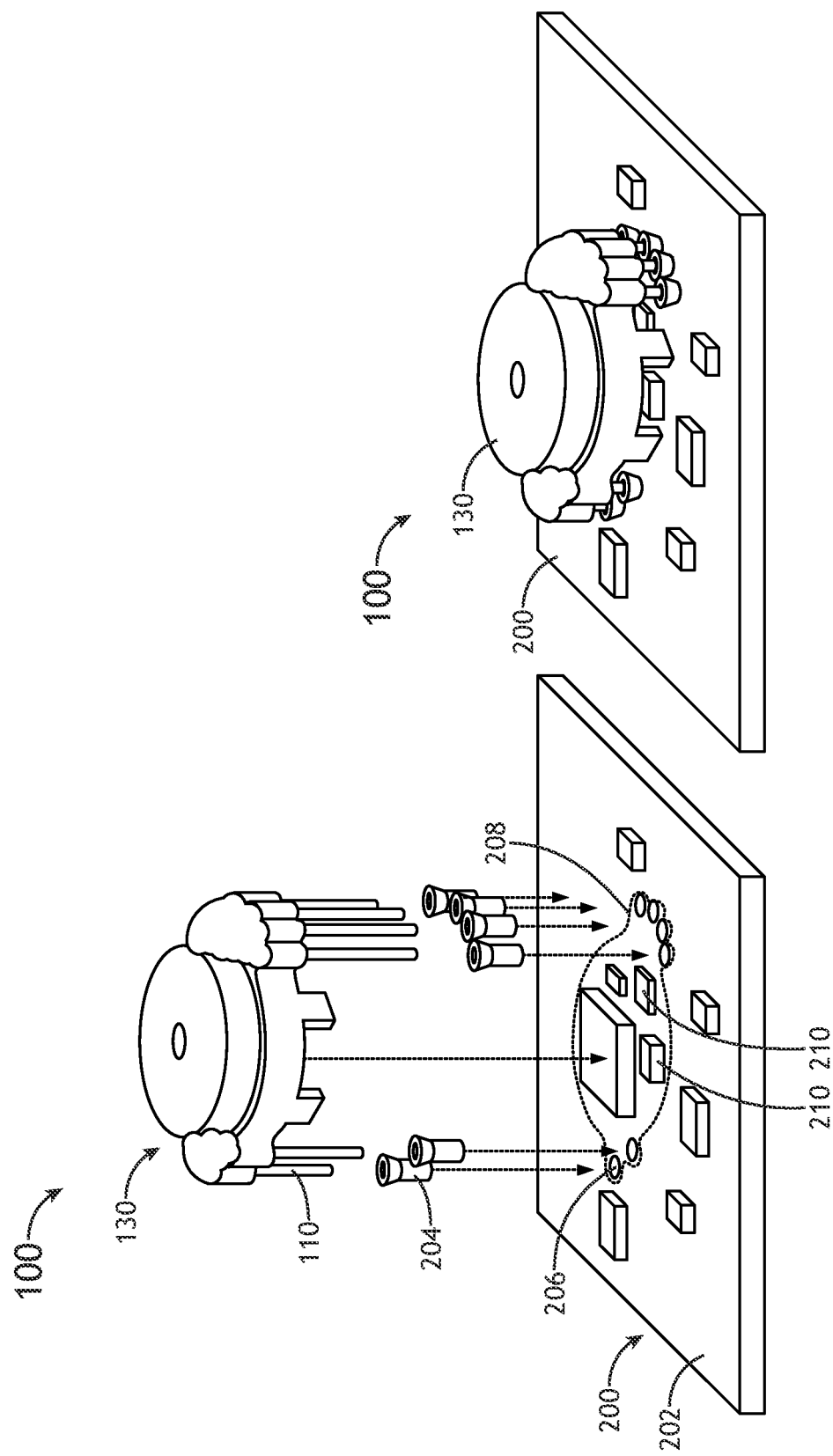
FIG. 2 is an exploded assembly view of a system including the power component next to an assembled system, in accordance with one or more embodiments of the present disclosure.
Figure 3:
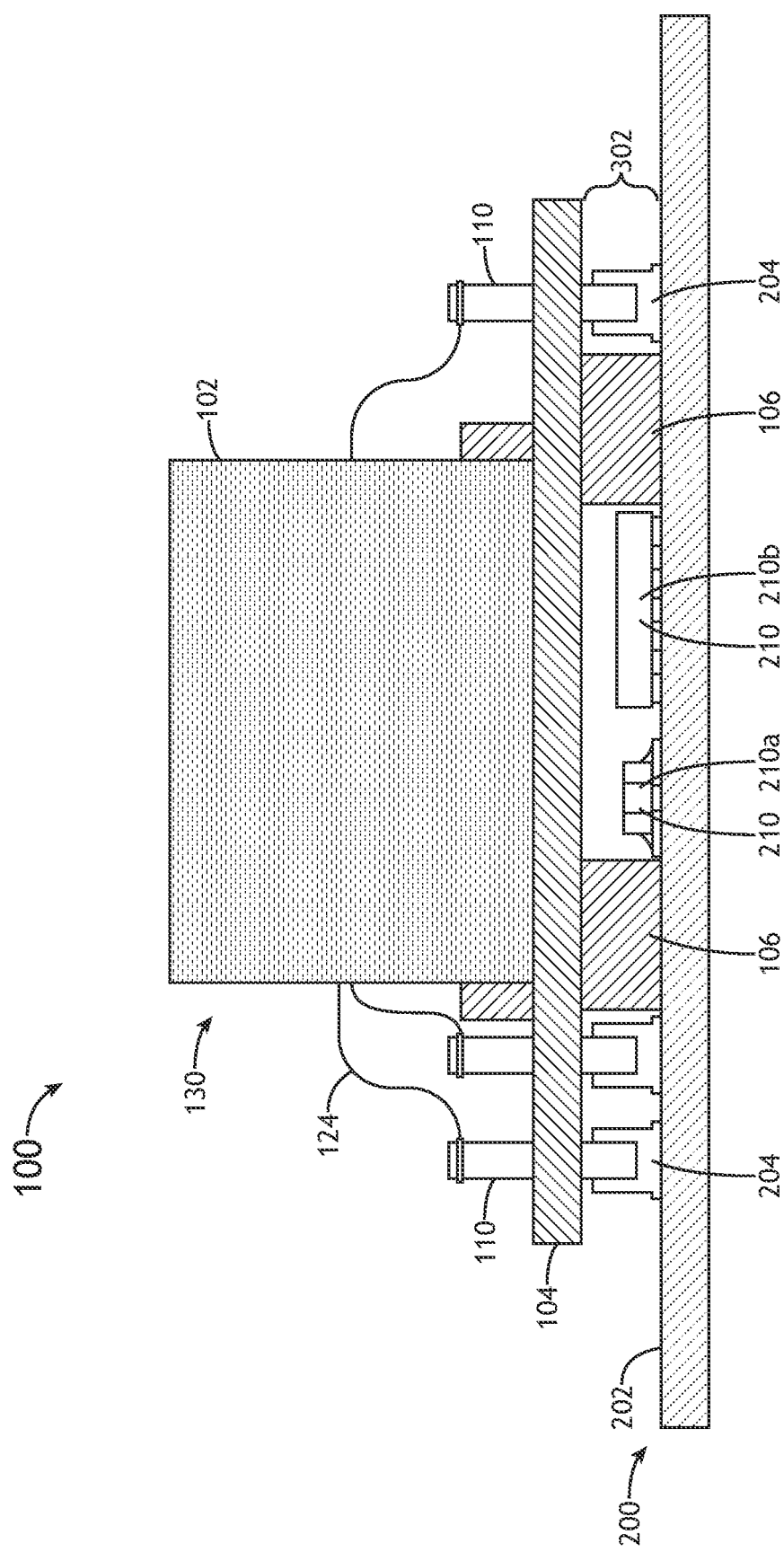
FIG. 3 is a front view of a system, in accordance with one or more embodiments of the present disclosure.

The receiving features 204 may be any receiving feature, such as sockets. For example, the sockets 204 may be through-sockets (e.g., passing through a PCB board), as shown in FIG. 2, configured to be received in holes 206. By way of another example, the sockets 204 may be surface-mount sockets 204, as shown in FIG. 3, configured to be mounted (e.g., soldered or any other method) to the top surface 202 of the PCB assembly 200.

The pins 110 and receiving features 204 may be configured in a non-rotationally-symmetric arrangement. For example, the pins 110 may be configured to only fit and couple in a single orientation, so as to prevent an incorrect mismatch of electrical wire leads 124.

The power sub-component 102 may be coupled to the carrier 104 via an adhesive 122 between the power sub-component 102 and the carrier 104.

The power component 130 may further include a potting agent material 114. The potting agent material 114 may be configured to encapsulate at least a portion of the power component 130. The potting agent material 114 reduces undesired particulates (e.g., water) from causing malfunction (e.g., rusting of metallic leads). For example, the potting agent material 114 may be disposed in, on, under, and/or the like the body 142, the pins 110, the wire leads 124, and/or any other exposed electrically activatable surfaces. For instance, the potting agent material 114 may encapsulate a top of the pins 110 that stick above the body 142, and an exposed end of the wire leads 124 coupled to the pins 110. The potting agent material 114 may include insulating material selected from a group consisting of epoxy, silicone, and polyurethane, and which in some embodiments may include any other thermosetting polymers known for their insulating and protective properties. The selection of the potting agent material 114 may be based on factors such as thermal conductivity, electrical resistivity, chemical resistance, and mechanical strength. The potting process may include preparing the power component 130, dispensing the potting agent material 114 into the recess 140 and/or over the desired components, and curing the material under specific conditions to ensure optimal encapsulation. The potting agent material 114 may be applied using techniques such as pouring, brushing, or with automated dispensing equipment for precision and consistency. Once cured, the potting agent material 114 may form a barrier that protects electrical components from environmental stressors such as moisture, dust, and vibration, while also contributing to the mechanical stability of the power component 130.

FIG. 2 illustrates an exploded assembly view of a system 100 next to an assembled system 100, in accordance with one or more embodiments of the present disclosure.

As noted, the printed circuit board assembly 200 may include receiving features 204 (e.g., sockets 204 to receive the pins 110). The sockets 204 may be soldered to the printed circuit board assembly 200.

The receiving features 204 shown are nonlimiting examples, and the removable coupling of the power component 130 may be based on any feature. For example, the pins 110 may be configured to provide a friction fit into sockets 204, such as via inward facing flaps that provide a spring-like force on the pins 110. By way of another example, the sockets 204 may include internal features configured to provide resistance to the pins 110 being pulled out, such as, but not necessarily limited to, tabs and corresponding slots, ribs and corresponding protrusions to nestle between the ribs, and/or the like.

FIG. 3 illustrates a front view of a system 100, in accordance with one or more embodiments of the present disclosure.

The receiving features 204 of the printed circuit board assembly 200 may include a plurality of sockets 204. The sockets 204 may be configured to receive the pins 110 of the power component 130.

The printed circuit board assembly 200 may include voids 206 (e.g., thru-holes) for receiving the receiving features 204.

The receiving features 204 may be disposed proximate to an outer footprint perimeter 208 of the power component 130 when the power component 130 is coupled to the printed circuit board assembly 200.

The printed circuit board assembly 200 may include the PCB components 210 inside the outer footprint perimeter 208. These PCB components 210 and their interconnections may allow for better utilization of space within the outer footprint perimeter 208.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "in embodiments", "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system comprising:
a power component configured to be removably couplable to a printed circuit board assembly, the power component comprising:
a power sub-component coupled to a plurality of wire leads;
a carrier comprising:
a body defining a recess configured to receive the power sub-component, wherein the body further defines attachment features for coupling the carrier to the printed circuit board assembly; and
a plurality of support legs extending from the body and configured to space the body an elevated distance above the printed circuit board assembly when the plurality of support legs are in contact with a top surface of the printed circuit board assembly,
wherein, by virtue of the plurality of support legs, the power component is configured to be elevated above PCB components extending from the top surface of the printed circuit board assembly; and
pins configured to be coupled to the plurality of wire leads, wherein the pins are configured to be inserted through the attachment features and into receiving features of the printed circuit board assembly to electrically couple the plurality of wire leads to the receiving features of the printed circuit board assembly.

2. The system of claim 1, wherein the pins are structurally rigid.

3. The system of claim 1, wherein the system further comprises the printed circuit board assembly.

4. The system of claim 3, wherein the receiving features of the printed circuit board assembly comprise a plurality of sockets configured to receive the pins of the power component.

5. The system of claim 4, wherein the printed circuit board assembly comprises: voids for receiving the receiving features.

6. The system of claim 4, wherein the receiving features are disposed proximate to an outer footprint perimeter of the power component when the power component is coupled to the printed circuit board assembly.

7. The system of claim 6, wherein the printed circuit board assembly comprises the PCB components inside the outer footprint perimeter.

8. The system of claim 1, wherein the power sub-component is coupled to the carrier via an adhesive between the power sub-component and the carrier.

9. The system of claim 1, wherein the pins are coupled to the plurality of wire leads via a bonding material.

10. The system of claim 1, wherein the power component further comprises a potting agent material configured to encapsulate at least a portion of the power component.

11. A system comprising:
a printed circuit board assembly; and
a power component configured to be removably couplable to the printed circuit board assembly, the power component comprising:
a power sub-component coupled to a plurality of wire leads;
a carrier comprising:
a body defining a recess configured to receive the power sub-component, wherein the body further defines attachment features for coupling the carrier to the printed circuit board assembly; and
a plurality of support legs extending from the body and configured to space the body an elevated distance above the printed circuit board assembly when the plurality of support legs are in contact with a top surface of the printed circuit board assembly, wherein, by virtue of the plurality of support legs, the power component is configured to be elevated above PCB components extending from the top surface of the printed circuit board assembly; and pins configured to be coupled to the plurality of wire leads wherein the pins are configured to be inserted through the attachment features and into receiving features of the printed circuit board assembly to electrically couple the plurality of wire leads to the receiving features of the printed circuit board assembly.

12. The system of claim 11, wherein the pins are structurally rigid.

13. The system of claim 11, wherein the power component further comprises a potting agent material configured to encapsulate at least a portion of the power component.

14. The system of claim 13, wherein the receiving features of the printed circuit board assembly comprise a plurality of sockets configured to receive the pins of the power component.

15. The system of claim 14, wherein the plurality of sockets are soldered to the printed circuit board assembly.

16. The system of claim 14, wherein the printed circuit board assembly comprises: voids for receiving the receiving features.

17. The system of claim 14, wherein the receiving features are disposed proximate to an outer footprint perimeter of the power component when the power component is coupled to the printed circuit board assembly.

18. The system of claim 17, wherein the printed circuit board assembly comprises the PCB components inside the outer footprint perimeter.

19. The system of claim 11, wherein the power sub-component is coupled to the carrier via an adhesive between the power sub-component and the carrier.

20. The system of claim 11, wherein the pins are coupled to the plurality of wire leads via a bonding material.

* * * * *